United States Patent [19]
Rosales

[11] Patent Number: 5,132,974
[45] Date of Patent: Jul. 21, 1992

[54] METHOD AND APPARATUS FOR DESIGNING INTEGRATED CIRCUITS FOR TESTABILITY

[75] Inventor: Barry C. Rosales, Acton, Mass.

[73] Assignee: SILC Technologies, Inc., Burlington, Mass.

[21] Appl. No.: 426,565

[22] Filed: Oct. 24, 1989

[51] Int. Cl.$^5$ .............................................. G06F 11/00
[52] U.S. Cl. ................................. 371/22.3; 371/22.1; 371/25.1
[58] Field of Search ............... 371/22.3, 22.5, 25.1, 371/22.1, 22.2

[56] References Cited

U.S. PATENT DOCUMENTS

| | | | |
|---|---|---|---|
| 3,761,695 | 9/1973 | Eichelberger | 235/153 AC |
| 3,783,254 | 1/1974 | Eichelberger | 235/152 |
| 3,784,907 | 1/1974 | Eichelberger | 324/57 DE |
| 4,534,028 | 8/1985 | Trischler | 371/25.1 |
| 4,602,210 | 7/1986 | Fasang et al. | 324/73 R |
| 4,669,081 | 5/1987 | Mathewes, Jr. et al. | 371/3 |
| 4,916,388 | 4/1990 | Sano | 324/158 R |

OTHER PUBLICATIONS

Williams, T. W. & Parker, K. P., *Design For Testability-A Survey*, Proceedings of the IEEE, vol. 71, No. 1, Jan. 1983.

Eichelberger, E. B. & Williams, T. W., *A Logic Design Structure for LSI Testability*, Proc. 14th Design Automation Conference, 1977, pp. 462-468.

Trischler, E., *Testability Analysis and Incomplete Scan Path*.

Trischler, E., *Incomplete Scan Path with an Automatic Test Generation Methodology*, 1980 IEEE Test Conference, Paper 7.1, pp. 153-162.

Buchanan, M. A., *Scan-Design Methods Increased Testability of Standard Cells*, Computer Design Magazine, Mar. 1, 1986.

Primary Examiner—Jerry Smith
Assistant Examiner—Ly V. Hua

[57] ABSTRACT

The invention is a method for designing testability into an integrated circuit. This method is termed register transfer scan (RTS). The RTS method comprises two primary rules. The first rule is that every global feedback path in the functional circuit must contain at least one scannable storage element, i.e. it must be accessible such that data can be placed into it or read from it without passing the data through the functional circuitry of the chip. The second rule of the RTS method is that the controls for those storage elements that are not scannable are held inactive when data is being scanned into or out of the scannable storage elements.

23 Claims, 4 Drawing Sheets

METHOD AND APPARATUS FOR DESIGNING INTEGRATED CIRCUITS FOR TESTABILITY

FIELD OF THE INVENTION

The invention relates to a method and apparatus for modifying the design of an integrated circuit to improve its testability. More particularly, the invention relates to a method of inserting test logic for implementing a partial scan testing technique into an application-specific integrated circuit design.

BACKGROUND OF THE INVENTION

In the circuit design of many integrated circuits, and particularly application specific integrated circuits (ASICs), significant efforts are made to design the circuit to facilitate operational testing. Operational testing refers to the testing of the circuit to determine if it performs the electrical functions it was designed to perform. In its simplest form, operational testing is performed by placing predetermined signals at the inputs of the circuit and reading the outputs to determine if they are the expected response to the selected input signals. However, rather than designing a circuit giving consideration only to the function to be performed, circuitry may be added to the design, including additional input and output pins, which will facilitate the testing of the chip.

In order to test an integrated circuit for every possible fault, one would need to input to the integrated circuit every possible combination of input states (i.e., test patterns), including every possible preceding state for circuits which include latches or other types of components with outputs that depend on a previous state, and read the outputs in response thereto. In LSI (large scale integrated) and VLSI (very large scale integrated) circuits, such exhaustive testing, particularly without modification for facilitating testability, is not feasible since the time required to perform such tests is excessive.

Typically, fault models are employed in determining and selecting the most useful test patterns for testing circuits. Using one of these fault models, a set of test patterns is generated which will test the circuitry with respect to a large proportion of possible operational faults, preferably using as few test patterns as possible. Methods exist for generating sets of test patterns. Dependent upon the circuit and the fault model used, the CPU time necessary to generate the appropriate set of test patterns can be significant. Each test pattern is placed at the inputs of a chip and the outputs in response thereto are observed. If one or more of the outputs do not match the expected results, then an operational fault is indicated.

A fault model that is used throughout the industry which covers a large majority of possible faults is known as the "Single Stuck-At" model. This model assumes that errors in the operation of an integrated circuit are the result of a single logic gate input or output being fixed to, or stuck at, either a logic 0 or a logic 1 level. A Stuck-At fault, for instance, exists where an input to a logic gate is perceived by that logic gate as a logic 1 regardless of the actual input voltage level. In the Single Stuck-At model, it is assumed that the circuit will contain one and only one stuck-at fault. Therefore, when using the single Stuck-At model, it is possible that circuits with multiple stuck-at faults will go undetected. In determining and selecting the set of test patterns to run through a given integrated circuit, it is typically desirable to test for approximately 95 to 100% of all possible single Stuck-At faults using as few test patterns as possible.

Typically, the more logic gates there are between the inputs to which the test patterns are applied (i.e., the inputs which are accessible to the tester) and the outputs from which the results are read (i.e., the outputs which are accessible), the more complicated and time-consuming are the generation of sets of test patterns as well as the actual testing.

One widely accepted method of decreasing the number of logic gates between the accessible inputs and outputs is called partitioning. The basic concept of partitioning involves isolating individual groups of logic gates from events occuring in the remainder of the integrated circuit and providing some means for a tester to be able to place signals directly at the inputs of the partitioned circuitry and to directly read the outputs of the partitioned circuitry. In this manner, the "partitioned" portions of the circuitry can be tested individually, thus reducing the overall number of test patterns necessary to adequately test the circuit. Test methods are available wherein the integrated circuit can be essentially partitioned such that individual groups of logic gates can be tested independently of the rest of the circuit. However, the added circuitry for providing the ability to partition and to directly access the partitioned circuitry, such as multiplexers for isolating individual groups of logic gates from the system clocks (partitioning) and shift registers for inputting test patterns as well as the extra pins for inputting the test patterns and reading the outputs, can greatly increase the necessary hardware. The testing overhead (the percentage of the chip circuitry which is provided for the purpose of testing) is commonly on the order of the 10-20% of the chip area.

There are two basic objectives in designing a chip for testability. The first objective is to design circuitry into the chip which increases its testability with a minimum amount of additional circuitry (hereinafter referred to as testing overhead or simply overhead). The second objective is to determine the set of test patterns to be used to test the chip which covers as many possible faults with as few test patterns as possible.

A description of many of the known testing methodologies for integrated circuits is found in Williams, T.W., & Parker K.P., *DESIGN FOR TESTABILITY—A SURVEY*, Proceedings of the IEEE, Vol. 71, No. 1, January 1983, pp 98-112.

One known methodology for implementing testability of an integrated circuit is the full scan method. The full scan methodology is described in detail in U.S. Pat. No. 3,784,907 issued Jan. 8, 1987, U.S. Pat. No. 3,783,254 issued Jan. 1, 1974 and U.S. Pat. No. 3,761,695 issued Sep. 25, 1973 all to Eichelberger. In the full scan methodology disclosed in these patents, every storage element is made scannable. By making every storage element directly accessible as a psuedo-primary input and output, the design is made essentially combinational. Several automatic test pattern generation algorithms exist for combinational designs.

It is relatively simple to design a circuit to implement the full scan methodology since there is no need to make decisions as to which storage elements to make scannable and which not to make scannable. Although simple to design, integrated circuits which are designed by the full scan method have a significant amount of testing circuitry overhead since every storage element is scannable.

Therefore, it is an object of the present invention to provide an improved method and apparatus for designing testability into integrated circuits.

It is another object of the present invention to provide a method of designing testability hardware into an integrated circuit design which can be implemented automatically by software.

It is one other object of the present invention to provide a methodology for testing integrated circuits and the like which requires greatly reduce circuit overhead.

It is yet a further object of the present invention to provide a method and apparatus for designing testability into an integrated circuit during the designing of the functional circuit.

SUMMARY OF THE INVENTION

The invention comprises a method for designing testability into an integrated circuit with a high level of coverage of possible faults but significantly reduced test circuit overhead. This method is termed Register Transfer Scan (RTS). The RTS method shares the same clocking rules as the full scan method of the prior art but includes two additional rules which provide significant advantages thereover. The first rule is that every feedback path in the chip, not including feedback paths within an individual data storage element (e.g., a flip flop), must contain at least one scannable storage element. A scannable storage element is one that can be accessed such that data can be placed in it or read from it without passing the data through the functional circuitry of the chip. This technique improves the controllability and observability of signals in the circuit. The second rule is that the control inputs, i.e., the clocks and resets, for those storage elements that are not scannable are held inactive during the scanning process. An integrated circuit which meets these two limitations can be treated, for test purposes, as a synchronous feedforward design. Since data can be directly placed in or read out of the scannable storage elements in the feedback paths, these scannable storage elements can be treated as primary inputs as well as primary outputs of the circuit. Therefore, for testing, each feedback path can be treated as a sychronous feedforward path since the path is "broken open" by the scannable storage element It is significantly simpler to test a feedforward design than a synchronous design with feedback.

The additional overhead circuitry necessary for scanning data into or out of the selected storage elements is kept to a minimum in the present invention. The scannable storage elements are coupled together in a secondary path (other than the functional path of the circuit) into a scan register. In the scan register, the individual scannable storage elements comprise individual sections of the scan register into which data can be sequentially scanned. Circuitry is provided to disable the system clocks and resets of the non-scannable storage elements during the scan mode. Often, circuitry for disabling clocks and resets is already included within a circuit for functional purposes and thus does not constitute testing overhead. Preferably, circuit paths are provided for allowing an external clock to control the scannable storage elements during scanning.

By coupling all scannable storage elements into a shift register, only a single input pin and a single output pin are needed to directly access all of the scannable elements. In this manner, a test pattern (or portions thereof) can be placed in the appropriate storage elements by sequentially shifting data into the scannable storage elements. Other portions of the test pattern are placed at the primary inputs and the system clocks are activated for a specified number of clock cycles. The results then appear at the primary outputs and in the scannable storage elements. The results can be read from the primary outputs as the circuit operates. However, to read the results in the scannable storage elements, the system clocks must be inhibited and the circuit must be placed in the scan mode again. At that point, the results can be sequentially shifted out of a scannable storage element for reading.

The Register Transfer Scan methodology, in a preferred embodiment, is included in a software program for designing application specific integrated circuits (ASICs) based on functional specifications but can also be used to modify structurally designed ASICs. In this manner, the ASIC can be designed with respect to functionality and testability concurrently. The RTS related software automatically locates feedback paths in a circuit and determines which storage element or elements in each feedback path to make scannable based on a number of weighted variables, some of which can be manually set. The choice as to which storage elements in the feedback path are made scannable depends upon such variables as whether it is preferred to minimize the testing circuitry overhead or the complexity and time to generate a set of test patterns, as well as other factors.

DETAILED DESCRIPTION OF A PREFERRED EMBODIMENT

Figure 1A:
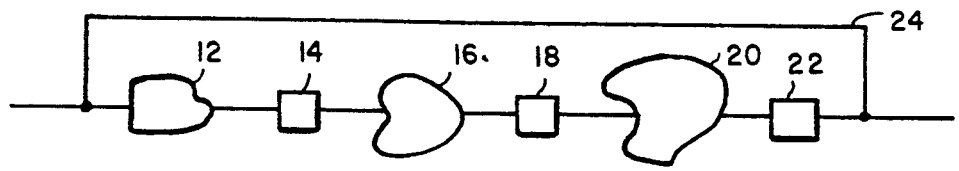
FIG. 1A shows a block diagram of an exemplary sequential circuit containing feedback, which includes no testability logic.

The present invention relates to a partial scan methodology, termed RTS (Register Transfer Scan), which provides a substantially equivalent level of coverage of possible faults to the full scan methodology but with greatly reduced overhead. Further, the methodology of the present invention allows the circuit designer to adapt the design of the testing circuitry to achieve a desired tradeoff between circuitry overhead, the time required to run a set of test patterns (i.e., the number of test patterns necessary to provide adequate error coverage) and the CPU time necessary to generate the appropriate set of test patterns.

The RTS methodology of the present invention takes advantage of the fact that sequential logic circuitry can be treated as a feedforward design by making scannable at least one storage element in every loop in the sequential circuit. Since every feedback path is "broken open" at least once, every feedback path can be treated as a part of a feedforward design where the path or paths through the scannable storage elements are treated as primary inputs and primary outputs. This provides significant advantages in terms of testability since testing a feedforward design (a design that contains no feedback paths other than sequential storage elements) is only slightly more difficult than testing a logic circuit comprising only combinational logic.

The Register Transfer Scan (RTS) methodology of the present invention is a partial scan methodology which requires substantially less test circuit overhead than the full scan method of the prior art. There are two basic rules in the RTS methodology. First, every global feedback path in the circuit, i.e., every feedback path not contained within a storage element, must contain at least one scannable element. Further, while data is being scanned into the scannable storage elements, the clocks and resets of those storage elements that are not scannable must be held inactive so that their states cannot change during scanning. The RTS method also shares the same clocking rules as the full scan method of the prior art. Given the two above-mentioned limitations and the clocking rules of the full scan method, any sequential logic circuit can be treated as a feedforward design.

In a preferred embodiment, certain types of storage elements are automatically made scannable regardless of whether they fall within the above-discussed rule for determining what storage elements to make scannable. In a preferred embodiment, all state registers, counters and shift registers are automatically made scannable. Although not necessary under the RTS method and increasing the overall testing overhead, it does so only slightly, while providing significant advantages in terms of simplifying the design of the circuit for testability.

With respect to shift registers, since they are already designed to be serially scannable, the testing circuit overhead for placing them in the scan register is minimal. Counters also require minimal overhead in order to be included in the scan register. Also, if counters are not made scannable, then in order to load a particular value into a counter, the counter must be repeatedly pulsed a number of times equivalent to the value which it is desired to place in the counter. For instance, placing a particular value in a 32 bit counter that is not scannable could take a significant amount of time.

Finally, state registers also require very little overhead to be made scannable. In addition, it is significantly simpler to make an entire state register scannable rather than to determine which bits should be made scannable and which should not be made scannable.

Also, in the preferred embodiment, the circuit designer can specify any particular storage element to be made scannable. During the design of the testing circuitry, the fact that the above-discussed storage elements are automatically made scannable affects the design. For instance, for feedback paths which contain one of the above discussed storage elements, the rule of having at least one scannable storage element in every feedback loop is satisfied for that loop and, therefore, it may not be necessary to make a particular storage element scannable which otherwise would have been made scannable.

The method of the present invention also allows the user to specify additional rules and parameters for the design of the testing circuitry. Most importantly, the user can specify a SEQUENTIAL DEPTH parameter for the design of the testing circuitry. The SEQUENTIAL DEPTH is a non negative integer which specifies the maximum distance a non-scannable storage element can be from a primary input or a scannable storage element. The distance is specified in terms of the number of clock pulses an input signal (or a scannable signal) requires to propagate to the non-scannable storage element. In most feedforward designs, the number of clock pulses that an input signal requires to propagate to a non-scannable storage element is equivalent to the number of storage elements between the input and the particular storage element. Thus, the greater the sequential depth, the greater the distance between scannable storage elements. The SEQUENTIAL DEPTH parameter is the parameter which provides the user the most direct control over the tradeoff between the testing circuitry overhead and time required to generate the set test patterns for the ASIC. As the SEQUENTIAL DEPTH parameter increases, the testing circuitry overhead decreases since there are fewer scannable storage elements. However, the fewer the number of scannable storage elements, the more complex and, therefore, time consuming it is to generate the set of test patterns which must be run in order to provide a specified percentage of coverage of possible faults. Since a larger number of combinational logic gates and storage elements exist between the point where primary or psuedo-primary inputs can be directly placed and primary or psuedo-primary outputs can be directly read, the calculation of the test patterns which must be run in order exercise the gates and storage elements to provide a certain percentage of coverage of possible faults is more complex. If the SEQUENTIAL DEPTH is specified as zero (i.e., there are zero non-scannable storage elements between the scannable storage elements), the RTS method creates a chip similar to a chip designed using the full scan method.

Figure 1B:
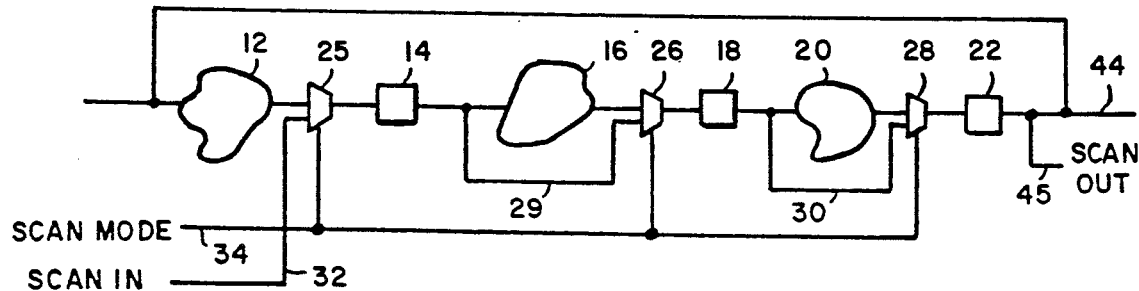
FIG. 1B shows the same circuit shown in FIG. 1A except with the addition of testability logic implemented in the full scan methodology of the prior art.
Figure 1C:
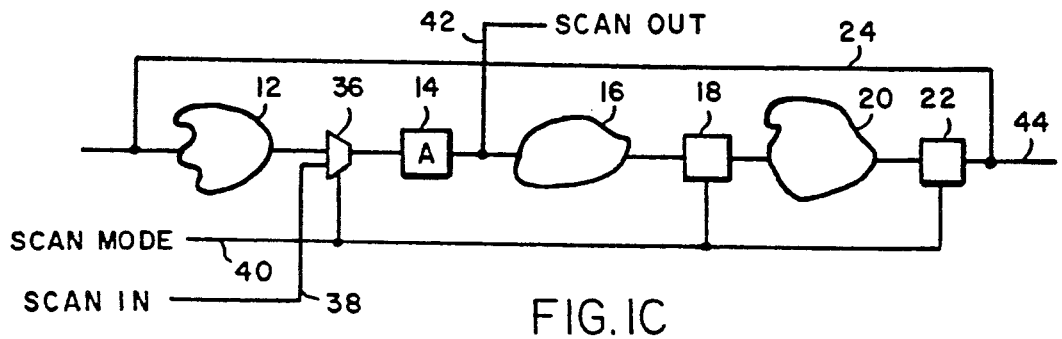
FIG. 1C shows the circuit of FIG. 1A except with testability logic inserted in accordance with the present invention.

FIGS. 1A-1C illustrate the advantages, in terms of reduced testing overhead of the partial scan methodology of the present invention, over that of a full scan methodology. In FIGS. 1A-1C, the irregularly shaped elements represent combinational logic and the squares represent storage elements. FIG. 1A illustrates a sequential circuit having no testability logic. The circuitry essentially comprises combinational logic and storage elements. In FIG. 1A, elements 12, 16 and 20 represent groups of combinational logic and elements 14, 18 and 22 represent groups of storage elements. A feedback path is shown at 24 and may contain additional combinational logic and storage elements (not shown). FIG. 1B illustrates the same circuit having testability logic inserted therein using the full scan method of the prior art. As shown therein, a multiplexer 25 is inserted before storage element 14 so as to allow the storage element to selectively receive data from the system (i.e. functional circuit) path or the scan path. Likewise, all other storage elements, 18 and 22, have a multiplexer, 26 and 28, respectively, inserted before their inputs. Additionally, circuit paths are inserted which provide a direct connection between the output of each storage element and an input of the multiplexer associated, with the succeeding storage element such as path 29 between flip flops 14 and 18 and path 30 between flip flops 18 and 22. Each multiplexer receives as inputs thereof the output of the preceding combinational logic in the system path, except the multiplexer associated with the first storage element 14 in the scan path which is coupled to receive the Scan-In line 32. The last storage element in the scan path is coupled via line 45 to the scan-out line. The Scan-In and Scan-Out lines 32 and 45, respectively, are directly accessable to the user and, for an integrated circuit chip, would be brought out to pins on the chip. Each multiplexer is further controlled by the Scan Mode input 34. When the Scan Mode signal is not asserted, the multiplexers are in system mode and pass the signals from the preceding combinational logic through to the associated storage element such that the circuit operates as if there was no testing circuitry added. However, when Scan Mode is asserted on line 34, the multiplexer selects the Scan-In line 32 instead of the input of the preceding combinational logic. The clock inputs to the storage elements 14, 18 and 22 (not shown in FIG. 1B) are controlled to pass the data sequentially scanned in on line 32 from one storage element to the succeeding storage element.

FIG. 1C illustrates the partial scan methodology of the present invention. In the RTS method of the present invention, only a single multiplexer 36 is inserted before storage element 14, and a scan-out line 42 is connected from storage element 14. The scan mode signal enables multiplexer 36 to pass scan-in signal 38 to storage element 14 and also disables the clocking of non-scannable storage elements 18 and 22. The circuit shown in FIG. 1C can be considered a feedforward design when in the scan mode since data can be placed directly in storage element 14 and read directly from storage element 14. For testing purposes, storage element 14 is both an input and an output, thus "breaking open" the feedback path such that it can be tested as a feedforward circuit.

Figure 1D:
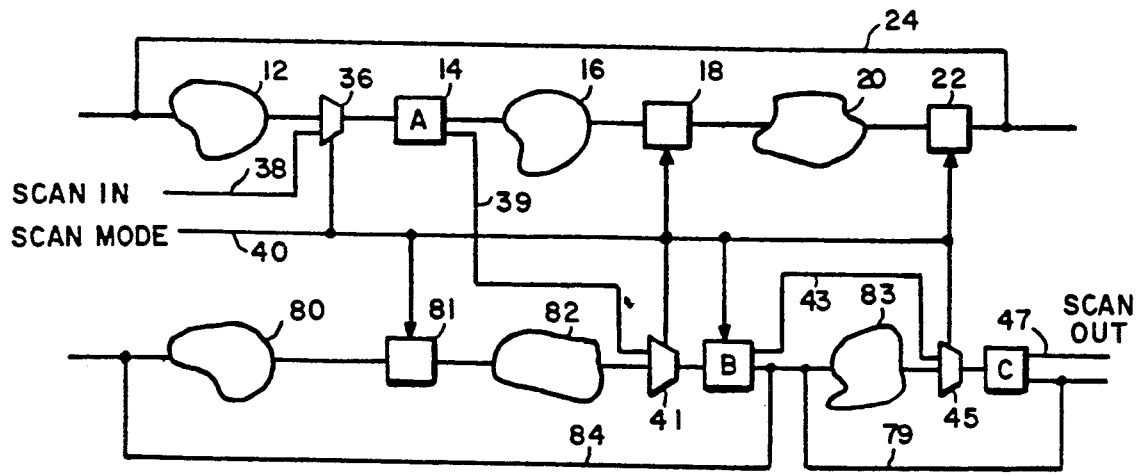
FIG. 1D shows the circuit of FIG. 1C embodied in a larger circuit including additional scannable storage elements.

If the circuit shown in FIG. 1C is part of a larger circuit containing other feedback loops and, therefore, other scannable storage elements, scan-out line 42, rather than going out to a pin on the chip is connected directly to the multiplexer of the succeeding scannable storage element in the scan register. The scan out line of the succeeding scannable storage element is likewise coupled to the next scannable storage element in the scan register until all scannable storage elements are sequentially coupled in the scan register. The scan-out line of the last scannable storage element in the scan register is connected to a scan out pin on the chip. Circuitry is inserted to cause the scan register, comprising all of the scannable storage elements, to act like a shift register when in the scan mode. The necessary circuitry will be described in detail hereinafter. FIG. 1D, for example, shows the circuit shown in FIG. 1C as a portion of a larger circuit which includes two additional feedback paths 79 and 84, two additional scannable storage elements B & C, one additional non-scannable storage element 81, and three additional combinational logic elements 80, 82 and 83. Assuming that a test pattern required the placement of a logic 1 in storage element A, a logic zero in storage element B, and a logic 1 in storage element C, the operation is as follows. Scan mode is asserted on line 40, and a 1 is placed on scan in line 38. The clock that controls storage elements A, B and C is asserted such that the 1 is scanned into storage element A and whatever state was previously in storage element A is sent to storage element B via line 39 and multiplexer 41. Likewise, whatever state was previously in storage element B is forwarded to storage element C through line 43 and multiplexer 45. A 0 is then placed on scan-in line 38 and the clock controlling storage elements A, B and C is asserted again. At this point, storage element B now contains the 1 which was previously in storage element A, and storage element A contains the 0 which was just placed on the scan-in line 38. Finally, a 1 is placed on the scan-in line 38, and the clock is asserted a third time. After the third assertion of the clock, the storage elements A, B and C no contain the desired code 1, 0, 1, respectively. It should be noted that storage elements A, B and C all must be controlled by a single clock when scanning in or scanning out data. Otherwise, data could be lost during the scanning.

In both the full scan and partial scan method, each test pattern in a set of test patterns is a combination of primary inputs and psuedo-primary inputs (i.e., data values to be placed in the scannable storage elements). The psuedo-primary inputs are set by scanning the data values into the scannable storage elements as described immediately above. After this is done, the primary inputs portion of the test pattern is placed at the primary inputs of the chip, and the circuit is taken out of scan mode and placed in test mode for a specified number of clock cycles. In test mode, the testing circuitry is shunted out of the circuit to allow the circuit to operate as it would normally operate absent any testing circuitry, but with one important exception. When the circuit is operating normally in its functional capacity (hereinafter termed system mode), the various storage elements may be clocked by any number of different clock signals. However, in test mode, all storage elements are controlled by a single clock (termed the test clock). The test clock is directly controllable by the testing personnel, thus providing greater control over the circuit for testing purposes. The number of clock cycles asserted during the test mode is also specified as part of the test pattern. Then, the primary outputs are read. Additionally, the system is placed back in scan mode by asserting the scan mode line 40, and the response of the system to the test pattern inputs is scanned out of the psuedo-primary outputs (i.e., the scannable storage elements) on line 47. At this time, the next test pattern is scanned into the scannable storage elements. In fact, in order to save testing time, the next test pattern can be scanned in simultaneously with the scanning out of the psuedo primary outputs produced by the previous test pattern.

Figure 2:
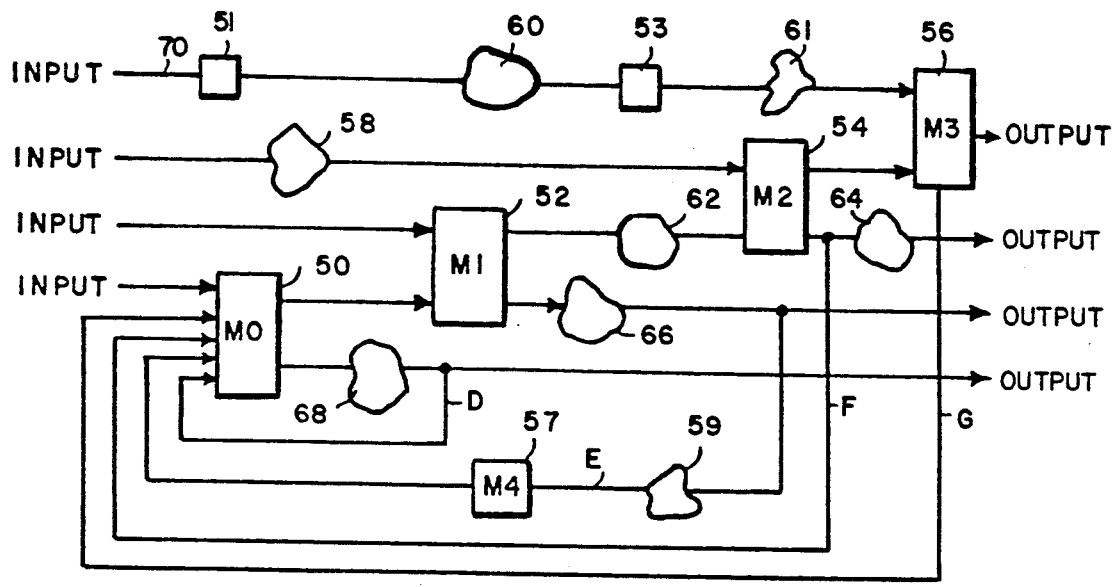
FIG. 2 illustrates an exemplary sequential circuit containing multiple, nested feedback loops.

FIG. 2 will help illustrate the method of the present invention. In FIG. 2, the square blocks represent storage elements, or, more accurately, collections of storage elements while the irregularly shaped blocks represent collections of combinational logic (including no storage elements). Thus blocks 50, 51, 52, 53, 54, 56 and 57 represent collections of storage elements while blocks 58, 59, 60, 61, 62, 64, 66 and 68 represent collections of combinational logic. In the circuit shown in FIG. 2, there are four feedback paths labeled D, E, F and G. The only storage element in feedback loop D is storage element 50. Feedback loop E includes storage elements 50, 52 and 57. Feed back loop F includes storage, elements 50, 52 and 54. Finally, feedback loop G includes storage elements 50, 52, 54 and 56. Storage element 50 appears in all of the feedback loops. Therefore, if storage element 50 is made scannable, and the remaining storage elements, elements 51, 52, 53, 54, 56 and 57 are modified so that their clocks and resets can be inhibited, then the circuit will meet all requirements of the present methodology. However, if the user had specified a SEQUENTIAL DEPTH of 2, for instance, then the design would have to be further modified. For instance, assuming that there is a single clock cycle delay between consecutive storage elements in the loops, storage element 56 would be three clock cycles distant from the nearest primary input, input 70, as well as three clock cycles from the nearest scannable storage element 50. Thus, if the SEQUENTIAL DEPTH were specified as 2, then the RTS methodology would make storage element 56 scannable.

Based on the circuit designed by the present methodology, a set of test patterns is generated for the chip. Test generation can also be performed by software programs In a preferred embodiment test generation is done by a FAN algorithm (fan out oriented test generation algorithm). One possible Fan-out-oriented test generation algorithm is described in Fujiwara, H. & Shimono, T., *On The Acceleration of Test Generation Algorithms*, IEEE Transactions on Computers, Vol. C-32, No. 12, December 1983, pp 1137-1144. Other test generation methodologies are also known in the art.

As stated above, when each feedback loop contains a scannable storage element, any sequential circuit can be treated as a synchronous feedforward design for testing purposes. However, the non-scannable storage elements must have their clocks and resets inhibited during the scanning in of the test patterns in order to prevent their states from changing in response to the data that is being scanned through the scannable storage elements.

The logic which is added to a functional circuit for implementing the RTS methodology will now be described. Logic is necessary to accomplish the following tasks; 1) couple the scannable storage elements together as a shift register, 2) allow the scannable storage elements to alternately be used as a shift register and as part of the functional circuit, 3) inhibit the clocks and resets of the non-scannable storage elements during scanning, and 4) provide means for altering the mode of operation of the circuit from normal system mode to at least a test mode and a scan mode.

The chip must contain a scan in pin and a scan-out pin for placing data in and reading data out, respectively, of the scannable storage elements via the scan register. These pins may be shared pins which also serve a functional purpose in the circuit when not in scan mode. A minimum of one more pin for testing is necessary to allow the tester to control the operational mode (e.g. system mode, test mode, scan mode) of the circuit. This pin can also be shared. If additional testing modes are to be provided, additional pins can be placed on the chip. However, it is preferable to provide a multi-bit test register, which operates as a shift register or a finite state machine, into which various bit patterns or states can be placed to provide the desired modes of operation. Associated logic for activating the various modes is also added. For instance, in order to allow selective enabling of the scan mode, circuitry is added within the path of every load enable condition of every storage element to inhibit a load enable condition created by the functional circuitry from reaching the storage elements when the circuit is in scan mode. Rather than placing separate load inhibit gates in the control line for each storage element, circuit overhead can be minimized by placing the load inhibit circuitry as close to the generation point of the load enable conditions as possible. This consolidation of load inhibit circuitry is possible since it is common for a single load enable condition to control a plurality of storage elements. Also, since the added condition must be placed on the load enable of every storage element, the inhibit circuitry can be placed at the source of each load enable condition.

This load inhibit circuitry provides the operation necessary to satisfy the second of the two primary rules of the RTS methodology, that of inhibiting the system clocks and resets of the non-scannable storage elements during scanning. However, it also performs the same function on the scannable storage elements.

Similar circuitry is placed in the reset paths of all storage elements to inhibit the system from resetting the storage elements while in scan mode.

Further circuitry is added to create a shift register comprising the scannable storage elements as individual storage sections thereof (i.e., the scan register). First, direct, uninterrupted circuit paths are added to connect all scannable storage elements in a consecutive chain. Since uninterrupted circuit paths already may exist between some of the scannable storage elements, additional paths are not necessary and further overhead can be saved. The scannable storage elements themselves are modified, as necessary for inclusion in the scan register. The scannable storage elements must be modified to provide two possible paths, the normal functional path of the circuit and the scan register path. In one possible embodiment, as illustrated in FIG. 1C, multiplexers are added to the front end of the scannable storage elements. The multiplexers receive as alternate inputs, the normal functional path input and the scan register input. The scan register input of a multiplexer is either the scan-out line of the preceding scannable storage element in the scan register or, in the case of the first storage element in the scan register, the scan in pin of the chip. The multiplexers also comprise control inputs which are responsive to a scan mode enable signal as shown in FIG. 1C. Reference is also made to U.S. Pat. No. 3,761,659 discussed above, which teaches one possible means of coupling the scannable storage elements into a scan register. With respect to storage elements already equipped with input multiplexers for functional circuit purposes an additional multiplexer is not necessary. Instead, an additional input to the multiplexer, taken from the preceding storage element in the scan register, is added. The control input to the multiplexer is also modified such that the scan register path is selected by the multiplexer when the scan mode enable signal is asserted. Even further, some storage elements in the scan register may already include, for functional purposes, a data input coupled from the preceeding storage element in the scan register. In such a situation, the only testing circuitry overhead necessary is circuitry to modify the load enable condition of the storage element to allow loading of data when the circuit is in scan mode. Thus, testing overhead can be even further reduced.

Figure 3A:
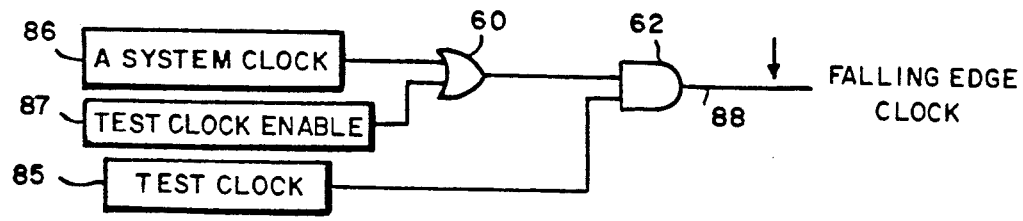
FIGS. 3A and 3B illustrate two types of circuits which can be inserted in a circuit design as part of the present invention to provide control of the storage elements by a test clock when in test mode.
Figure 3B:
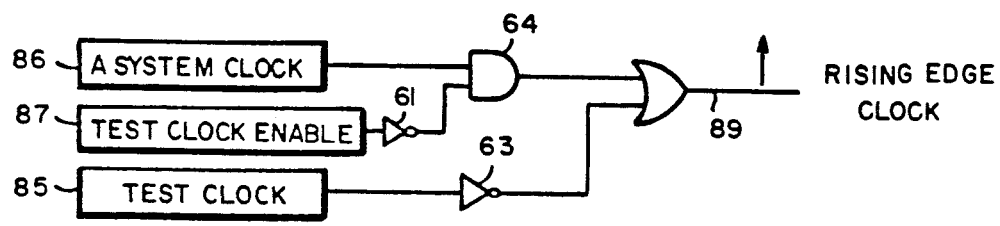

An additional requirement for the scan register is the need to provide clock pulses simultaneously to all scannable storage elements during the scan mode. In order for the data bits to be sequentially shifted through the scan register without loss of data, all of the scannable storage elements must be pulsed simultaneously. FIGS. 3A and 3B illustrate one possible clock gating logic structure to provide this feature. FIGS. 3A and 3B illustrate circuitry for providing a simultaneous test clock pulse to all falling edge and rising edge activated storage elements, respectively. A separate test clock 85 can be derived from one of the functional clocks in the circuit or alternately, an external pin can be added to the chip, and the test clock can be supplied externally.

The system clock which is normally provided in system mode to a given storage element or storage elements, is shown at 52 in FIGS. 3A and 3B. An additional signal, test clock enable is shown at 87. Test clock enable 87 may be provided externally via an extra pin or may be provided on the chip and controlled by means of a test register. The outputs 88 and 89 of the circuits shown in FIGS. 3A and 3B, respectively, are provided to one or more falling edge activated storage elements or rising edge activated storage elements, respectively. In the case of falling edge activated storage elements, the circuitry shown in FIG. 3A comprising OR gate 60 and AND gate 62 causes the output 88 to be responsive only to the test clock signal 85 when the test clock enable signal 87 is asserted (logic high), regardless of the state of the system clock 86. Conversely, when the test clock enable signal 87 is not asserted (logic low), and the test clock is maintained high, the output 88 is responsive to the system clock signal 86. If the test clock 85 is provided through a pin, it may be desirable to provide a pull-up resistor at that pin to keep the test clock signal 85 at logic high when no test clock is connected thereto.

In a similar manner, the circuitry shown in FIG. 3B for rising edge activated storage elements, comprising inverters 61 and 63 and AND gate 64, allows the output 89 to be responsive solely to the test clock signal 85 when the test clock enable signal 87 is asserted (logic high). When the test clock enable signal 87 is asserted, the output 89 remains in the inactive state (logic low) until the test clock is activated. Similarly, to the circuit shown in FIG. 3A, when the test clock enable signal 87 is not asserted and the test clock signal 85 is maintained low, the output 89 is responsive to the system clock 86. Thus, by appropriate setting of the test clock enable signal and the test clock signal 85, either the test clock or the system clock controls the associated storage elements.

Circuitry similar to that discussed immediately above can be provided to the reset inputs of the storage elements to control the reset lines in a similar manner. A test reset signal can be derived on the chip or can be provided externally via an extra pin.

Having described the test logic used for implementing the RTS methodology, the algorithm for selecting the storage elements to be made scannable will now be described. In a preferred embodiment, the RTS algorithm is implemented by a software program. In its most effective implementation, the RTS software is included as part of a circuit design software package. Various software packages are known which design a circuit based on functional input statements of the desired operation of the circuit. Software for implementing the RTS methodology can be included as part of such a software package. The RTS software may be executed after the basic functional circuit is designed but before it is formalized.

Figure 4A:
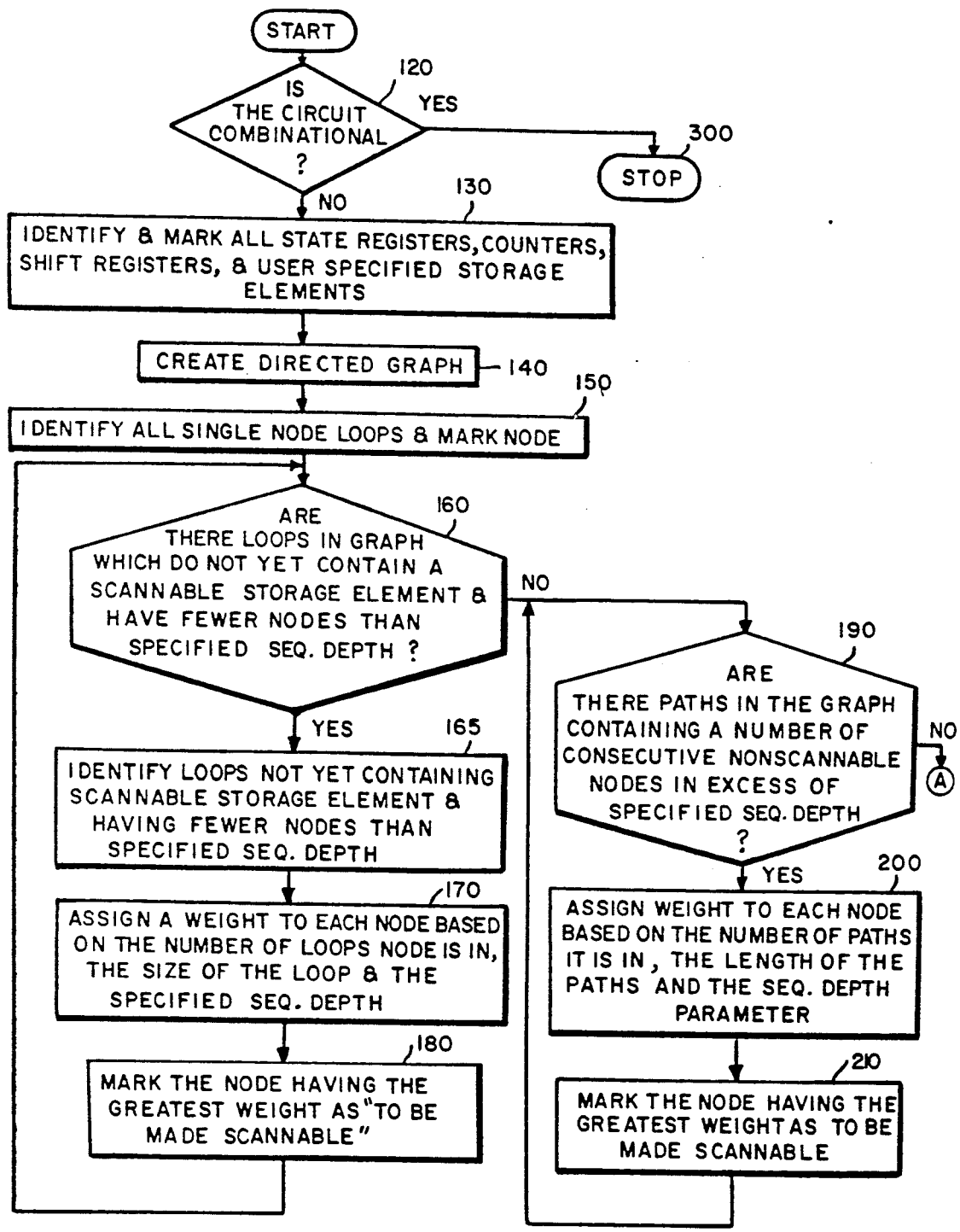
FIGS. 4A and 4B illustrate a flow chart of one possible algorithm for implementing the present invention.

FIG. 4 is a flow chart illustrating one possible algorithm for implementing the RTS methodology. It should be understood, however, that there are numerous alternative techniques for implementing the steps of the RTS method. The discussion below merely describes one preferred algorithm. The algorithm described below is a heuristic method; however, exact methods for determining the storage elements to be made scannable are also available. In the flow chart of FIG. 4, the user interface aspects of the software are not shown. For instance, in this flow chart, it is assumed that the user has already selected the desired SEQUEN-TIAL DEPTH, and has identified any specific storage elements which he specifically requires to be made scannable. The first step in the methodology is to determine if any modification is even necessary. If the circuit is strictly combinational, then no modification of the circuit is necessary under the present invention. Therefore, in step 120, the circuit is checked to determine if it is a strictly combinational circuit. If the circuit comprises strictly combinational logic, then the program is not run and control is sent to the stop step 300. If the circuit is not strictly combinational, program flow is directed toward step 130 where all state registers, counters, shift registers, and user specified storage elements are marked as "to be made scannable". Then, in step 140, the software models the circuit as a directed graph. In a directed graph, all collections of storage elements are drawn as nodes and all paths through combinational logic between nodes are shown as directed lines coupling the respective nodes together. In step 150, all loops containing only a single node (storage element) are identified and the nodes in those loops are marked as "to be made scannable". Referring to the exemplary circuit shown in FIG. 2, storage element 50 would be marked as "to be made scannable" in step 150.

After steps 130 through 150 are performed, the next step is to identify the remaining loops and choose the "best" storage elements to be made scannable. A preferred method of determining the "best" storage elements is shown in step 160 of the flow chart. First, in step 160, it is determined if there are any loops remaining in the circuit which do not contain a scannable storage element and which do not contain a number of nodes in excess of the specified SEQUENTIAL DEPTH. If the answer to step 160 is no, then programming is forwarded to step 190. However, if there are loops which meet the two above mentioned criteria, then programming continues on to step 165. In step 165, the program determines all the loops in the directed graphs which meet the two criteria stated in step 160. In step 170, each node in these loops is assigned a WEIGHT based upon the number of loops it is in, and the size of the loops it is in. The formula used is shown immediately below.

Weight (i) = (Loop count(i))$^2$/(L·Sum Loops count (j)) where

Weight (i) = Weight assigned to node i, wherein Loops (i) is the set of loops containing node i Loop count (i) = the number of loops in Loops (i)

L = sequential depth of shortest loop in Loops (i)

Loop count (j) = the number of loops in Loops (j), wherein Loops (j) is the set of loops containing node j Sum Loops count (j) = the sum of all Loops count (j) for j set to every node appearing in a loop in Loops (i), except node (i).

After a WEIGHT is assigned in step 170, programming is forwarded to step 180 where the node having the greatest WEIGHT is marked as "to be made scannable". At that point, programming is looped back to step 160 to determine if there are any loops remaining which do not yet contain a scannable storage element. Programming loops through steps 160, 165, 170 and 180 until there is a scannable storage element in all feedback loops that have a number of nodes less than or equal to the specified SEQUENTIAL DEPTH. At that point, the outcome of step 160 is NO, and programming continues on to step 190.

In step 190, it is determined if there are any paths in the circuits that violate the SEQUENTIAL DEPTH parameter. The SEQUENTIAL DEPTH parameter defines the maximum distance that a non-scannable storage element can be from the nearest primary input or scannable storage element, regardless of whether the path is in a loop. Thus, in step 190, the program determines whether there are any paths (which may include the loops which are longer than the SEQUENTIAL DEPTH parameter which were not dealt with in steps 160-180) in the directed graph which contain a greater number of consecutive non-scannable storage elements than the specified SEQUENTIAL DEPTH parameter. If the outcome of step 190 is yes, in step 200, each node that is in at least one of these paths is assigned a weight based upon the number of such paths it is in, the size of the paths, and the SEQUENTIAL DEPTH parameter. A preferred formula for calculating the weight of these nodes is shown immediately below.

Weight (i) = (Path count (i))$^2$/(1 + Path segment count (i)) where,

Weight (i) = weight assigned to node (i)

Paths (i) = the set of paths which contain node (i)

Path count (i) = the number of paths in Paths (i)

Path segment count (i), wherein Path segments (i) is the set of path segments obtained by removing node (i) from each path in Paths (i), wherein Paths (i) is the set of paths which contain node (i) (Note; if node (i) is the first or the last node in a path, then only a single segment is created; however, if node (i) is in the middle of a path, two segments are created) = the number path segments in Path segments (i)

Figure 4B:
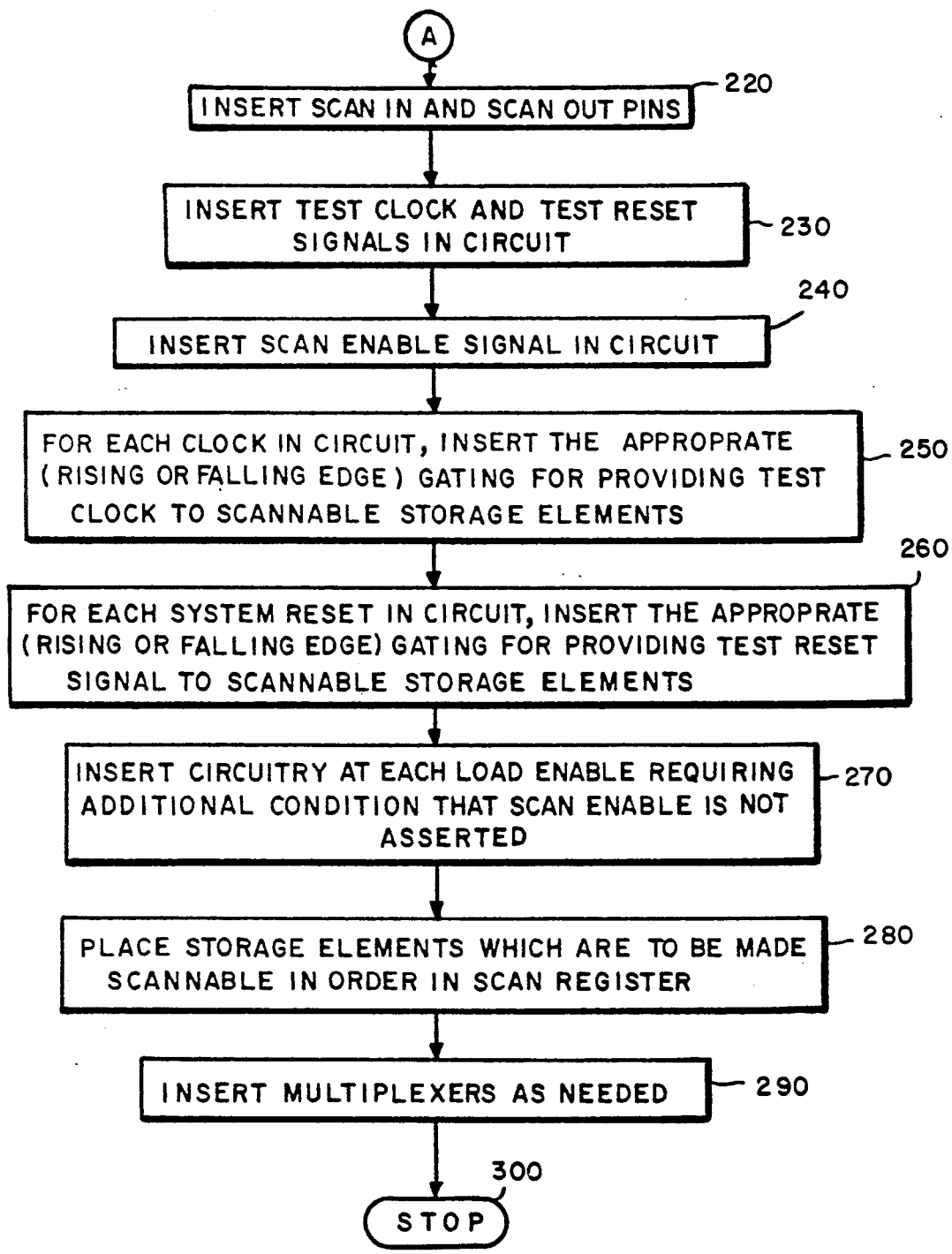

After the node weights are calculated, programming is advanced to step 210 where the node having the greatest weight is marked as "to be made scannable". At this point, programming is returned to step 190 and the program continues to loop through steps 190, 200 and 210 until there are no more paths in the graph which contain a number of consecutive non-scannable nodes in excess of the specified SEQUENTIAL DEPTH. Only then does programming continue on to step 220 (FIG. 4B).

In step 220, a scan-in pin and a scan-out pin are added to the circuitry. In step 230, the test clock and test reset signals are provided on the chip either by deriving them from signals already on the chip, by providing an additional clock or reset signal on the chip, or by providing extra pins for external signals to be coupled to the chip, as explained previously. In step 240, the scan mode enable signal is provided in the circuit, preferably as described previously.

In step 250, the circuitry described with respect to FIGS. 3A and 3B for selectively allowing control of the storage elements by the system clocks or the test clock, is provided where appropriate. In step 260, the same is done with respect to the reset signals.

In step 270, circuitry is inserted which adds the condition that scan enable is not asserted before the load enable of any storage element can be activated. In step 280, the software examines the list of storage elements which are to be made scannable and places them in a particular order defining the order of the scan register. In placing the storage elements in order in the scan register, consideration is given to functional paths already existing in the circuit which may be usable for the scan register. Testing circuitry overhead can be reduced by using the same paths in the scan register. Also, in step 280, the scan-in pin is placed before the first scannable storage element in the scan register, and the scan-out pin is placed after the last scannable storage element in the scan register.

Now having an ordered list of the elements which are to be scannable, in step 290, multiplexers are added at the front end of the scannable storage elements as previously described, or, if a multiplexer already exists at this point for functional purposes, an additional input from the preceding element in the scan register is added. Control circuitry is also inserted as previously described which causes the multiplexer to select the scan register input when the scan mode enable signal is asserted. At this point the algorithm is completed, and the test inserting program is stopped at step 300.

Having thus described a few embodiments of the invention, various alterations, modifications and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

What is claimed is:

1. A method of modifying the design of a functional electrical circuit to simplify operational testing of said circuit by means of inputting a set of test patterns and observing results at outputs of said circuit, said circuit comprising storage elements and combinational logic, said method comprising the steps of;

making at least one storage element in each global feedback path, but less than all storage elements in said circuit, scannable such that data can be placed in and read from said at least one scannable storage element without passing said data through said combinational logic of said circuit, providing means in said circuit for selectively placing said circuit in one of a set of modes, a first one of said modes being a scan mode in which data can be placed in and read from said scannable storage elements, and providing circuit means for inhibiting the storage elements in said circuit which are not scannable from changing state when said circuit is in scan mode.

2. A method as set forth in claim 1 wherein said storage elements are made scannable by the steps of;

interconnecting said scannable storage elements into a scan register in which said scannable storage elements are sequentially coupled in a specified sequential order, adding a scan in signal line to said circuit, said scan-in signal line having a first end coupled to an input of a first one of said sequentially ordered scannable storage elements in said scan register and a second end which can be coupled to receive test patterns, adding a scan out signal line having a first end coupled to receive an output from a last of said sequentially ordered scannable storage elements and a second end from which data can be read out of said scan register, adding a scan mode signal line to said circuit which, when in a first state, places said circuit in a scan mode, adding circuit means to said scannable storage elements for selectively coupling said scannable storage elements in one of said scan register and said functional circuit, said circuit means being responsive to said scan mode signal being in said first state for coupling said scannable storage elements in said scan register.

3. A method as set forth in claim 2 wherein said means for selectively placing said circuitry in one of a set of modes is responsive to said scan mode signal for placing said circuit in said scan mode.

4. A method as set forth in claim 3 further comprising the step of making scannable all shift registers, counters and state registers in said circuit.

5. A method as set forth in claim 3 further comprising the step of making scannable any predetermined storage element in said circuit.

6. A method as set forth in claim 3 further comprising the step of making additional storage elements scannable such that the sequential depth of all non-scannable storage elements is less than or equal to a preselected SEQUENTIAL DEPTH parameter.

7. A method as set forth in claim 6 wherein said circuit is an integrated circuit.

8. A method as set forth in claim 7 wherein said circuit is an application specific integrated circuit.

9. A method as set forth in claim 8 further comprising the steps of;
adding a test clock signal path in said circuit,
providing a test clock,
adding a test-clock-enable signal path in said circuit, and
adding means in said circuit, responsive to said test-clock-enable signal, for causing said storage elements to be responsive to said test clock when said test-clock-enable signal is in a first state and responsive to a functional enabling signal in said circuit otherwise.

10. A method as set forth in claim 9 wherein, when said scan mode signal and said test-clock-enable signal are in said first states, data is sequentially scanned into said scannable storage elements from said scan-in signal line, responsive to said test clock.

11. A method as set forth in claim 10 wherein, when said scan mode signal is not in said first state and said test clock-enable signal is in said first state, said circuit is in a second one of said set of modes, termed test mode, in which all storage elements are responsive to said test clock.

12. A method of designing a functional electrical circuit for performing specified electrical functions and including circuitry to facilitate operational testing, said circuit comprising storage elements and combinational logic, said method comprising the steps of;
designing said circuit based on said specified electrical functions,
identifying all global feedback paths, but less than all storage elements in said circuit, in said circuit,
modifying at least one storage element in each of said global feedback paths, but less than all storage elements in said circuit, to be selectively coupled in a scan register in which all storage elements of said scan register are sequentially coupled such that data can be sequentially loaded into said storage elements in said scan register when said scan register is enabled,
providing means for selectively placing said circuit in a scan mode in which said scan register is enabled,
providing means in said circuit for inhibiting storage elements in said circuit which are not scannable from changing state when said circuit is in said scan mode.

13. A method as set forth in claim 12 further comprising the step of adding circuit means to said scannable storage elements for selectively coupling said scannable storage elements in one of said scan register path and said functional electrical circuit path.

14. A method as set forth in claim 13 further comprising the step of making scannable all shift registers, counters and state registers in said circuit.

15. A method as set forth in claim 13 further comprising the step of making scannable any predetermined storage element is said circuit.

16. A method as set forth in claim 13 further comprising the step of making scannable additional storage elements such that the sequential depth of all non-scannable storage elements is less than or equal to a preselected sequential depth.

17. A method as set forth in claim 16 wherein, when said scan mode signal and said test-clock-enable signal are in said first states, data is sequentially scanned into said scannable storage elements in response to said test clock.

18. A method as set forth in claim 17 wherein, when said scan mode signal is not in said first state and said test-clock-enable signal is in said first state, all storage elements are responsive to said test clock.

19. A method as set forth in claim 13 further comprising the steps of;
adding a test clock signal path in said circuit,
providing a test clock,
adding a test-clock-enable signal path in said circuit, and
adding means in said circuit, responsive to said test-clock enable signal, for causing said storage elements to be responsive to said test clock when said test-clock-enable signal is in a first state and responsive to a functional signal in said circuit otherwise.

20. A method of modifying the design of a functional electrical circuit to simplify operational testing of said circuit by means of inputting test patterns and observing results at outputs of said circuit, said circuit comprising storage elements, combinational logic, primary inputs and primary outputs, said method comprising the steps of;
a) modeling said circuit as a directed graph in which all of said storage elements are nodes and all circuit paths through combinational logic from one node to another node are lines,
b) identifying all global feedback paths in said directed graph which contain only one node,
c) marking said identified nodes as to be made scannable,
d) if there is at least one loop in said directed graph which does not contain a node marked as to be made scannable and which does not comprise more than X nodes, where X is a specified SEQUENTIAL DEPTH, assigning a weight to each non-scannable node, i, in said directed graph according to the equation
Weight $(i) = (\text{Loop count } (i))^2 / (L \cdot \text{Sum Loop count } (j))$,
e) marking the storage element corresponding to the node assigned the greatest weight as to be made scannable,
f) repeating steps d) and e) until no loops remain in said directed graph which do not meet the criteria set forth in step e, g) if there are any paths in said directed graph containing more than X consecutive nodes which are not marked as to be made scannable, assigning a weight to each non-scannable node, i, in said directed graph according to the equation Weight$_2$ (i)=(Path count (i))$^2$/(1+Path segment count(i)), h) marking the storage element corresponding to the node having the greatest weight as to be made scannable, i) repeating steps g) and h) until no paths remain in said directed graph which do not meet the criteria set forth in step h), j) adding a test clock signal and a test reset signal to said circuit, k) adding a scan enable signal to said circuit, l) for each clock in said circuit, inserting circuit means for selectively disabling said clock and substituting therefor said test clock signal, m) for each reset in said circuit, inserting circuit means for selectively disabling said reset and substituting therefor said test reset signal, n) adding circuitry means for inhibiting the storage elements in said circuit from changing state when said scan enable signal is in a first state, o) creating a sequential list of said storage elements which are marked as to be made scannable, p) adding to said circuit a scan-in input and a scan-out output, q) adding as the first element in said sequential list said scan in input and adding as the last element in said sequential list said scan-out output, and r) adding means to said circuit for connecting all elements in said sequential list in the specified sequential order when said scan enable signal is in said first state.

21. A method as set forth in claim 20 further including the step of marking all state registers, counters and shift registers as to be made scannable before performing step a).

22. An electrical circuit for performing a specified electrical function and adapted to facilitate functional testing of said circuit, said circuit comprising;

storage elements and combinational logic arranged in a pattern for performing said specified electrical function, said pattern including global feedback paths, wherein at least one storage element in each global feedback path, but not all storage elements in said circuit, includes scan logic means allowing data to be placed in or read from said at least one storage element, means for placing said circuit in one of a plurality of modes, said modes including a scan mode in which data is placed in or read from said at least one storage element, and a system mode in which said circuit performs said specified function, and circuit means for inhibiting said storage elements which do not include scan logic means from changing state when said circuit is in scan mode.

23. An apparatus for modifying the design of a functional electrical circuit to simplify operational testing of said circuit by means of inputting a set of test patterns and observing results at outputs of said circuit, said circuit comprising storage elements and combinational logic, said apparatus comprising:

means for making at least one storage element in each global feedback path, but less than all storage elements in said circuit, scannable such that data can be placed in and read from said at least one scannable storage element without passing said data through said combinational logic of said circuit, means for placing in said circuit means for selectively setting said circuit in one of a plurality of operational modes, including a scan mode in which data is placed in and read from said scannable storage elements, and means for placing in said circuit means for inhibiting the storage elements in said circuit which are not scannable from changing state when said circuit is in said scan mode.

* * * * *